United States Patent
Escamilla et al.

(10) Patent No.: US 8,964,401 B2
(45) Date of Patent: Feb. 24, 2015

(54) ELECTRICAL INSULATOR CASING

(75) Inventors: Eduardo Escamilla, Round Rock, TX (US); Marco Marroquin, Austin, TX (US); William John Morris, Round Rock, TX (US); John Trevor Morrison, Round Rock, TX (US); Thomas Paul Parker, Dallas, TX (US); Stephen Wurmlinger, Scurry, TX (US)

(73) Assignee: SunPower Corporation, San Jose, CA (US)

( * ) Notice: Subject to any disclaimer, the term of this patent is extended or adjusted under 35 U.S.C. 154(b) by 280 days.

(21) Appl. No.: 13/292,251

(22) Filed: Nov. 9, 2011

(65) Prior Publication Data

US 2013/0094151 A1 Apr. 18, 2013

Related U.S. Application Data (60) Provisional application No. 61/547,516, filed on Oct. 14, 2011.

(51) Int. Cl.
*H05K 5/00* (2006.01)
*H05K 5/06* (2006.01)

(52) U.S. Cl.
CPC .................................... *H05K 5/065* (2013.01)
USPC ........... 361/752; 361/713; 361/714; 361/720; 174/260; 174/546; 174/548

(58) Field of Classification Search
USPC ................... 361/676–678, 679.46–679.54, 361/688–722, 752, 760, 831
See application file for complete search history.

(56) References Cited

U.S. PATENT DOCUMENTS

| | | | |
|---|---|---|---|
| 5,258,888 A * | 11/1993 | Korinsky | 361/704 |
| 5,946,193 A | 8/1999 | Hendrix et al. | |
| 6,778,388 B1 | 8/2004 | Minelli | |
| 7,450,382 B1 | 11/2008 | Fischer et al. | |
| 8,542,512 B2 * | 9/2013 | Garrity | 363/131 |
| 2005/0135065 A1 * | 6/2005 | Nakatsu et al. | 361/703 |
| 2007/0165376 A1 * | 7/2007 | Bones et al. | 361/688 |
| 2010/0033885 A1 | 2/2010 | Hotchkiss et al. | |
| 2010/0164346 A1 | 7/2010 | Li et al. | |
| 2010/0263704 A1 | 10/2010 | Fornage et al. | |
| 2011/0026873 A1 | 2/2011 | Hodono | |
| 2011/0194322 A1 * | 8/2011 | Nakasaka et al. | 363/141 |
| 2011/0204715 A1 * | 8/2011 | Nakamura et al. | 307/10.1 |

OTHER PUBLICATIONS

International Search Report and Written Opinion in PCT Application PCT/US2012/059672, Mar. 25, 2013.

(Continued)

*Primary Examiner* — Courtney Smith
(74) *Attorney, Agent, or Firm* — Grasso PLLC; Fred Grasso

(57) ABSTRACT

Systems, processes, and manufactures are provided that employ a casing associated with an electrical component to provide some, most, substantially all or all electrical insulative protection necessary for the electrical component. This casing may be further employed with potting or other materials to supplement and add additional or different protections for the component. These additional protections can include additional insulative resistance, thermal protection, moisture protection and other buffers to and from the environment.

21 Claims, 11 Drawing Sheets

(56) References Cited

OTHER PUBLICATIONS

W.L. Gore & Associates, Inc., Gore Tamper Respondent Surface Enclosure for High Security Applications, Preliminary Data Sheet, Sep. 22, 2007, Elkton, MD, USA.

Protocase Designer, Mounting Printed Circuit Baords (PCB), undated, www.protocasedesigner.com.

Ilknur Baylakoglu, Craig Hillman, and Michael Pecht, Characterization of Some Commercial Thermally-Cured Potting Materials, International IEEE Conference on the Business of Electronic Product Reliability and Liability, 2003.

3M Scotch-Weld Epoxy Potting Compound/Adhesive DP270 Clear Black, Dec. 2009.

* cited by examiner

ELECTRICAL INSULATOR CASING

BACKGROUND

The present invention relates to insulative casings that partially or fully insulate electrical components. In the present invention, the insulative casings may serve to provide electrical insulative resistance, thermal insulative resistance, reduced weight, or other benefits for electrical components associated with the casing.

When operating and performing their designed functions, printed circuit boards (PCBs) and other electrical components may be deployed and operated in harsh environments. As protection, rigid metal boxes are often used to protect the electrical components from moisture, heat, or other damaging environmental forces. In certain applications rigid metal boxes may also be used to protect electrical components from physical loads, e.g., dynamic loads and static loads.

BRIEF SUMMARY

Embodiments of the invention include casings or other systems that may serve to, among other things, buffer electrical components from the environment, dissipate heat, decrease weight, and provide electrical insulation.

In embodiments, systems, processes, and manufactures are provided that employ a casing somehow associated with an electrical component to provide some, most, substantially all, or all electrical insulative protection necessary for the electrical component. This casing may be further employed with potting or other materials to supplement and add different or additional protections for the component. These additional or different protections can include additional insulative resistance, thermal protection, moisture protection, and other buffers to and from the environment.

In embodiments, use of a casing with electrical resistance may provide for use of potting and other materials previously disfavored or excluded from use with similar designs because the protections or buffers provided by the potting or other material may be supplemented by the casing and the material comprising it. In embodiments, the casing may have various configurations and features and may be used in conjunction with an enclosure having various configurations and features. Likewise, processes may employ either or both, and may vary when either or both a casing and an enclosure are employed.

Embodiments may include a power converter comprising a plurality of electrical components connected to a printed circuit board, an outer enclosure surrounding one or more of the electrical components, an electrical insulative casing positioned between one or more of the electrical components and the outer enclosure, the casing comprising a polymer or other nonmetallic material, and a potting material, wherein the potting material may be positioned between the electrical insulative casing and one or more of the electrical components. Still further, the potting material in embodiments may be insufficient by itself to meet Underwriter Laboratory requirements for insulative capacity, and the insulative casing alone or in combination with the potting material may be sufficient to meet or exceed Nationally Recognized Test Laboratories (NRTL) requirements for insulative capacity of electrical components within the outer enclosure. These NRTLs may include Underwriters Laboratory (UL), Canadian Standards Association (CSA), Interek, ETL, ANSI, ASTM, NFPA, NOM, and TUV standards and performance requirements. These NRTLs may vary by country and may vary by industry as well. For example, when renewable energy sources such as wind or solar are used in conjunction with the PCBs one set of standards may apply while a different or varied set of standards may apply when other components are connected to the PCBs.

In embodiments the outer enclosure may have five or more sides, the printed circuit board may comprise a solar photovoltaic module microinverter having a DC input and an AC output, and the outer enclosure may have one or more thermal pads. In embodiments, the casing may include a top having a full skyline or partial skyline profile, where the full skyline profile may mimic a profile of several electrical components, and the partial skyline profile may mimic a profile of at least one electrical component.

Still further details of embodiments include that the outer enclosure may comprise a base with casing spacers, one or more thermal pads, and means for connecting the base with a cover, and wherein the base and a cover may be sealable with a sealing gasket, and wherein a connecting means is outside of the perimeter of the sealing gasket. The outer enclosure may also include a cover with one or more domes, a sealing edge and a plurality of tabs, the sealing edge and plurality of tabs positioned to mate with the base when the outer enclosure is in a closed configuration.

Embodiments may also include processes that may include positioning a printed circuit board within an electrical insulative casing; positioning the printed circuit board and insulative casing within an outer enclosure; and before or after each of the previous positioning steps, deploying a potting material near and around electrical components on the printed circuit board, the potting material insufficient by itself to provide the amount of electrical insulative resistance necessary to satisfy NRTL electrical requirements for the printed circuit board and electrical components. This process may further include punching out a punchout on the insulative casing, placing a gasket between a top of the outer enclosure and a bottom of the outer enclosure, and securing the outer enclosure top to the outer enclosure bottom with fasteners positioned outside of the gasket and a seal created by the gasket mating with the outer enclosure top and the outer enclosure bottom.

Still further features and processes and embodiments may also be possible. These embodiments, features, and related teachings are provided throughout this disclosure. Moreover, it is to be understood that both the foregoing summary and the following detailed description are exemplary and intended to provide further explanation without limiting the scope of the invention as claimed.

DETAILED DESCRIPTION

Embodiments include an enclosure or packaging with an insulative casing serving to provide electrical insulation for components within or associated with the casing. The insulative casing may be used with potting material and an outer enclosure to electrically insulate, protect, or dissipate heat from a printed circuit board or other electrical component. In embodiments, the electrical insulative properties of the casing may serve to reduce the use of potting material or other electrical insulative materials and may also serve to increase the selection of suitable potting material or other electrical insulative materials. In other words, by using an insulative casing, the amount of other material and the suitable selection of other material, such as potting, used to protect or buffer the electrical component, may be reduced as the casing can provide some or all of the requisite electrical insulation for the component.

Casings may have various features, may take various configurations, and may be comprised of various materials. For example, casing embodiments may have one or more defined openings. These openings may be used for accessing the components behind the casings, may be used during manufacture, may be used to transport thermal energy away from or through the casings, and may be used for other reasons as well.

Embodiments may be assembled by mounting a PCB to the base of an outer enclosure via standoffs of the enclosure base. In embodiments the outer enclosure may be aluminum, steel, rigid plastic, and various other rigid materials. A DC cable from a renewable energy source, having two conductors (a plus and a minus), and an AC cable, having four conductors (line 1, line 2, neutral, and ground), may each be connected to the PCB and the enclosure using the standoffs. For the AC cable, the ground conductor may also be electrically coupled to the enclosure, serving to ground the outer enclosure. For the DC cable, either wire may be connected to the enclosure and, therefore, grounded.

In embodiments, during assembly, potting material may be injected through a port or other opening in the enclosure, filling the voids around the PCB and around the components on the PCB. Once a sufficient amount of potting material is injected, the port or other opening may remain or may be sealed. In embodiments, particularly hot components may also be thermally coupled to an outer enclosure through an opening or port in the casing. A thermal pad may be positioned with and traverse the opening or port such that an outer enclosure may serve as a heat sink.

Previously unfeasible potting material that was, for example, outside of NRTL norms or criteria, may be selected in embodiments. Potting material employed in embodiments may be used to reduce, minimize, or prevent moisture from reaching the PCB, may be used for thermal dissipation, may be used for additional electrical insulation, and may be used for other reasons as well. In embodiments, suitable potting material may be selected after considering its properties and performance. For example, the selection of suitable potting materials may include passing certain reliability tests, such as "humidity-freeze" tests, where a PV microinverter is repetitively heated in a moist environment and then cooled well below freezing. This repeated loading and subsequent analysis may be beneficial to determine if the potting is sufficient to retard or prevent meaningful moisture from being driven into the enclosure by temperature differentials. The testing and analysis performed to select the potting material may also consider thermal dissipation properties of the potting material so that heat generated by certain components may be spread across a larger area. In other words, material near the heat source may be selected based upon its ability to dissipate or distribute heat from and about the components of a PCB.

In embodiments, various potting materials, including potting previously deemed inadequate, may be considered and used. For example, in embodiments, regulatory ratings for flame, temperature, insulation or other properties, from NRTLs, such as Underwriter's Laboratory, which previously served to limit the number of suitable potting materials, may no longer be applicable or may serve to exclude fewer potting materials from being considered suitable for use. The increased number of available potting material may allow selection and use of potting material previously disfavored or considered unavailable. This increased range of potting materials may include use of more flexible or lighter potting material as well as potting material with a broader range of suitable thermal properties.

In embodiments, the properties of the potting material or its reduced volume may each individually and cumulatively serve to reduce mechanical forces on components touching the potting material. Cyclical stresses on inductor cores, solder joints, and larger components (such as film capacitors), which may be pried off the PCB, may also be reduced in embodiments.

Still further, embodiments may also include selection of potting material considering its viscosity. For example, more viscous potting materials may be preferred as the material may have improved flow during manufacture or curing. Likewise, potting materials with improved preheating and flame rating limit characteristics may also be selected.

In embodiments, the outer enclosure may be designed such that a single side, rather than two, may be mounted to a photovoltaic module frame. Also, the outer enclosure may have improved sealing designs such that a top and bottom cover have securements with reduced risk of compromising the seal between the top cover and the bottom cover. Also, in addition to solar microinverter applications, other renewable energy technology applications, such as wind, thermal, etc. may also benefit from embodiments.

Still further, in embodiments, the casing may be configured to conform to the skyline of the circuit board. This variable surface may reduce the amount of potting material needed to cover targeted areas of the circuit board or the entire circuit board. In other words, reducing and tailoring the space between the PCB and the casing, and the size and dimension and attributes of the casing, can serve to channel potting material flow and the amount of potting material needed to cover targeted areas of the PCB. In embodiments, the casing may be made from various materials, including various polymers and plastics, and may be clear, translucent, and opaque.

In embodiments, certain designs may be targeted to substantially decrease the dependence of a PCB, such as a microinverter in an array of photovoltaic modules, on a specific type or types of potting material. Here and with other embodiments, design aspects may include using an encapsulated plastic casing that can be vacuum-formed to follow the "skyline" of the PCB components. Also, the base enclosure may be cast so that features, such as heat sinks and standoffs, can be embedded in the enclosure itself. The enclosure base may comprise five of the six sides needed to complete the enclosure, forming an "open box" and the cover component may essentially be a flat metal plate in embodiments. Here and in other embodiments, the cover and base may be sealed through a gasket, such as an inexpensive gasket. Also, the cover and base may be fastened together on the outer perimeter, so that few or none of the fasteners penetrate the area inside the seal. Still further, in this and other embodiments, the potting material may reside within the plastic casing and the enclosure may be a relatively long and narrow rectangle.

In preferred embodiments, the casing may be a polymer that can provide electrical insulation between an outer metal enclosure and an internal PCB. As such, potting material employed no longer needs to have the same degree of insulation resistance or flame ratings required for systems without the casing. In embodiments, the use of a casing may increase the available selection of suitable potting material. This increased assortment of potting material may allow for reduced costs, lighter weights, less viscous potting materials, and more compliant (softer) potting materials. While other benefits may inure also, none of these benefits may be found in certain embodiments.

Figure 1:
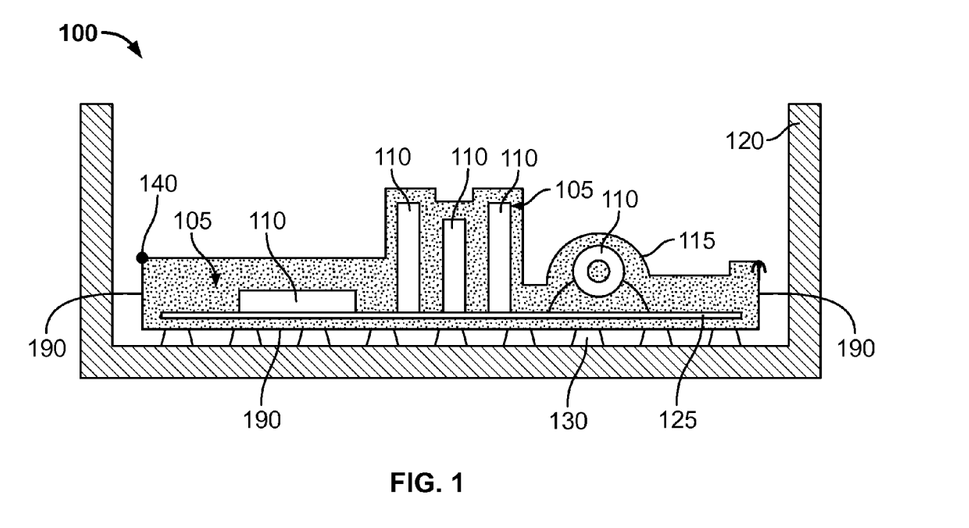
FIG. 1 is a side sectional view of an enclosure with an insulated shield casing and electrical components in accord with embodiments.

FIG. 1 shows a side sectional view of an electrical enclosure 100. Labeled in FIG. 1 is an outer enclosure base 120, a casing top 115 with a full skyline profile, and potting material 105 between the casing top 115 and the other casing surfaces 190. Also labeled in FIG. 1 are various exposed and covered electrical components 110, spacer supports 130 positioned beneath the casing surface 190, and a printed circuit board 125. In this and other embodiments, the outer enclosure base 120 may have a cover as well. This cover is not shown in FIG. 1.

In embodiments, and as shown in FIG. 1, the casing top 115 may have a hinge connector 140, connecting it to the other casing surface 190. This hinge connector 140, an example of a connecting means, may allow the casing top 115 to move away from the remaining casing surface 190, and may also provide alignment during assembly. The hinge connector may be a permanent pivot point or a connection that can be connected and disconnected. Various other connecting means, other than or in addition to the connecting hinge may also be used. These means include cup and ball type systems, tab and receiving groove systems, coupled pivoting systems, and pivoting systems that can be decoupled.

In embodiments, and as demonstrated in FIG. 1, the casing top or bottom or both, may fully mimic the skyline of the PCB and the electrical components thereon. In so doing, potting material 105 placed within the casing can be reduced because the cavity being filled is tailored. As shown below, in addition to a full skyline profile, casing may also partially mimic the profile of the PCB or electrical components or may not mimic the PCB or electrical component profile at all.

As noted earlier, the use of the casing around the printed circuit board and its electrical components may help to reduce the amount of potting material needed to protect the printed circuit board and its electrical components from freeze, thaw, moisture, and other environmental hazards. The casing may also provide sufficient or supplemental electrical resistance such that the amount of potting material may be reduced and a larger selection of potting material may be selected from. As can be seen, in embodiments, the potting material 105 may not be in contact with the outer enclosure base 120. This absence of contact may serve to reduce the forces placed on the electrical components due to expansion and contraction of the potting material. In still further embodiments, the potting material may be outside of the casing as well, and may also be in contact with one or more surfaces of the outer enclosure. In preferred embodiments, however, contact with the potting material and the outer enclosure may be minimized or eliminated.

As can also be seen, in embodiments, spacer supports may be present on one or more surfaces of the enclosure 120. These spacer supports 130 may help align and position the casing, printed circuit board, and electrical components within the enclosure 120. The spacer supports 130 may be uniformly positioned, may be nonuniformly positioned, and may be positioned at various locations in order to properly support, secure, and align components within the enclosure 120.

As can also be seen in FIG. 1, the potting material 105 may completely or substantially fill the space within the casing. In other embodiments, potting material may not completely fill the space such that voids or gaps may exist between the potting material and the casing material. And, in preferred embodiments, little if any potting material will be placed or expand outside of the casing after placement. As can be further seen in FIG. 1, certain fragile components, such as inductors, diodes, thin-film capacitors, and resistors, which lack packaging or have exposed leads, may themselves be completely surrounded by the potting material such that leads from these components may not only receive thermal insulation from the potting material but may also receive structural support and cushioning from the potting material as well.

Space beyond the case and within the cover may accommodate thermal expansion and contraction of the potting material without offering resistive forces sufficient to damage electrical components or a PCB within the potting material. In embodiments, thermal pads may be employed to transport heat from a heat generating component, through the casing, and to the outer enclosure. These thermal pads may be formed on the outer enclosure and may be added as well. In each instance, the outer enclosure may serve as a heat-sink for the heat generating components. In embodiments, potting material may also serve to distribute and dissipate thermal energy from heat generating components. In addition, the thermal distributive and conductive properties of the potting may be better or substantially better than those properties of the casing. Still further, when materials are selected in embodiments, they may be selected such that thermal dissipation required for the system may be partially satisfied, substantially satisfied, or fully satisfied by the potting or the potting and the outer casing and the electrical insulative properties may be partially satisfied, substantially satisfied, or fully satisfied by the casing.

Figure 2:
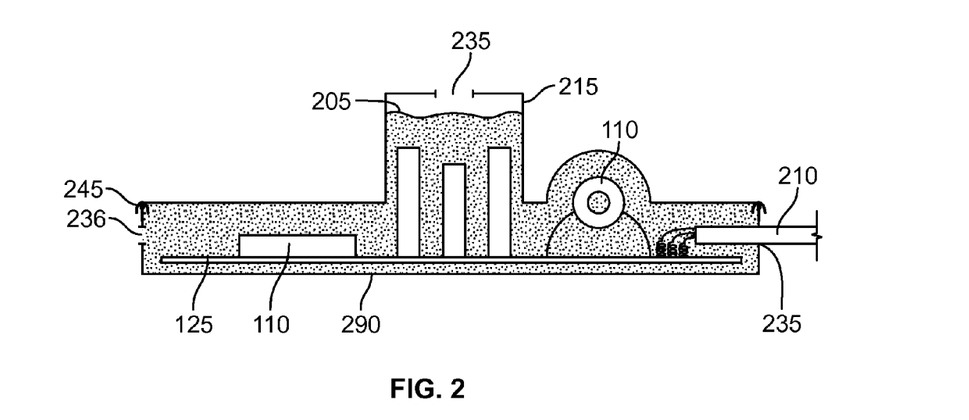
FIG. 2 is a side sectional view of an insulated shield casing and electrical components in accord with embodiments.

FIG. 2 shows a side sectional view of the casing surrounding a printed circuit board in accord with embodiments. As can be seen in FIG. 2, the casing top surface 215 is connected to the casing bottom surface 290 with connectors or connecting means 245. These connectors or connecting means 245 permit the casing top surface 215 to be completely removed from the casing bottom surface 290 during assembly, and, in some embodiments, afterwards as well. Also labeled in FIG. 2 are ports 235, electrical components 110, printed circuit board 125, cable 210, and potting material surface 205. As can also be seen in FIG. 2, the potting material may not completely fill the space within the casing. For example, the potting material surface 205, which is lower than the casing top surface 215, demonstrates how potting material voids may exist within the casing.

During assembly, potting material may be injected through the ports 235 in order to fill spaces in and around the printed circuit board 125 and the components 110 positioned thereon. In embodiments, potting material may also be deposited with the top in an open position by placing potting material under, on and around the printed circuit board and the electrical components and then finishing the deployment of the potting material after the casing top surface is in place and in its final position. The connectors 245 may allow for alignment, as well as securement, and may be a permanent as well as a removable connection type. The ports 235 may be temporary and or permanent, and may have flow blocking means 236 serving to prevent multi-directional flow of potting through the port and outside of the casing during or after assembly. In other words, the flow blocking means 236 may provide for flow of potting material into the casing but retard its flow out of the casing. This flow blocking means 236 may comprise a scored opening or more elaborate designs, such as a valve.

As can also be seen in FIG. 2, in embodiments, the cable 210 may provide for connections to and from the printed circuit board and its components. As can also be seen, port 235 through which the cable 210 passes may be sized and positioned such that moisture and other external components may be unable to enter the casing once the cable 210 is in position. In addition, the potting material placed on the inside of the casing may further serve to prevent moisture from entering and coming in contact with the various components of the PCB.

Figure 3:
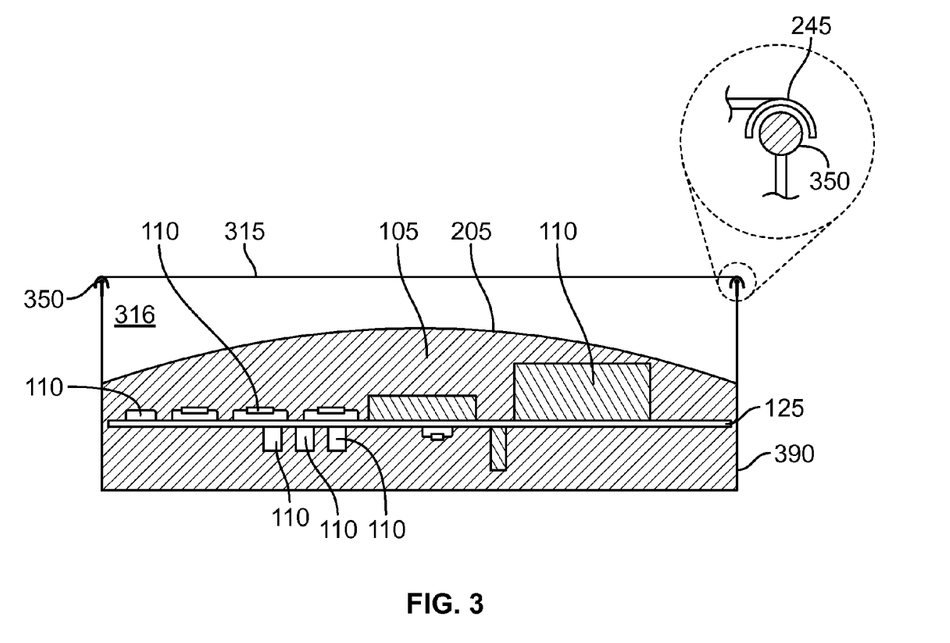
FIG. 3 is a side sectional view of an insulated shield casing and electrical components in accord with embodiments.

FIG. 3 shows another embodiment in which the casing surrounds a printed circuit board having components in a potting material 105 placed in and around the electrical components 110. FIG. 3 shows a connecting means having an upper socket connector 245 and a lower ball connector 350 along external surfaces of the casing. These connectors can provide for the attachment between the top surface casing 315 and the bottom casing surface 390. FIG. 3 also shows a potting material 105, a potting material surface 205, and exposed electrical components 110.

As can be seen in FIG. 3, and as discussed above, the exposed electrical components 110 may be present on both the top and bottom of the printed circuit board 125 during assembly. Potting material may be placed in and around electrical components and a printed circuit board and may not completely fill the space within the casing. Moreover, the casing surface may not provide a full skyline as in FIG. 1 or partial skyline as in FIG. 2, but may, instead, simply be a substantially or fully planar surface as shown in FIG. 3.

As can also be seen in FIG. 3, a void 316 may exist between the potting material surface 205 and the casing top surface 315. In embodiments, and as shown in FIG. 3, a cured potting material surface may be a rough surface that varies over the printed circuit board 125 and may be sufficiently thick to simply cover the components in the printed circuit board to a minimum, but not necessarily a consistent thickness. The minimum may be set to provide adequate environmental protections, including thermal protection and moisture protection. In embodiments, the viscosity of the potting material before curing may influence the profile and thickness of the finally cured potting material. When high viscosity potting materials are selected it may be preferable in embodiments to use curing forms to control the thickness of the cured potting material by retarding its propensity to flow and self-level during curing.

Figure 4A:
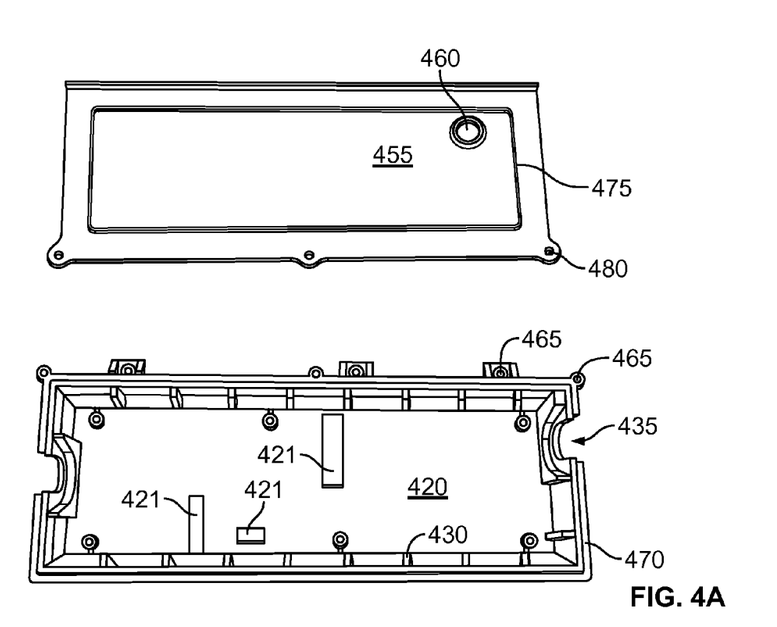
FIG. 4A is a top view of an enclosure top and an enclosure base in accord with embodiments.
Figure 4B:
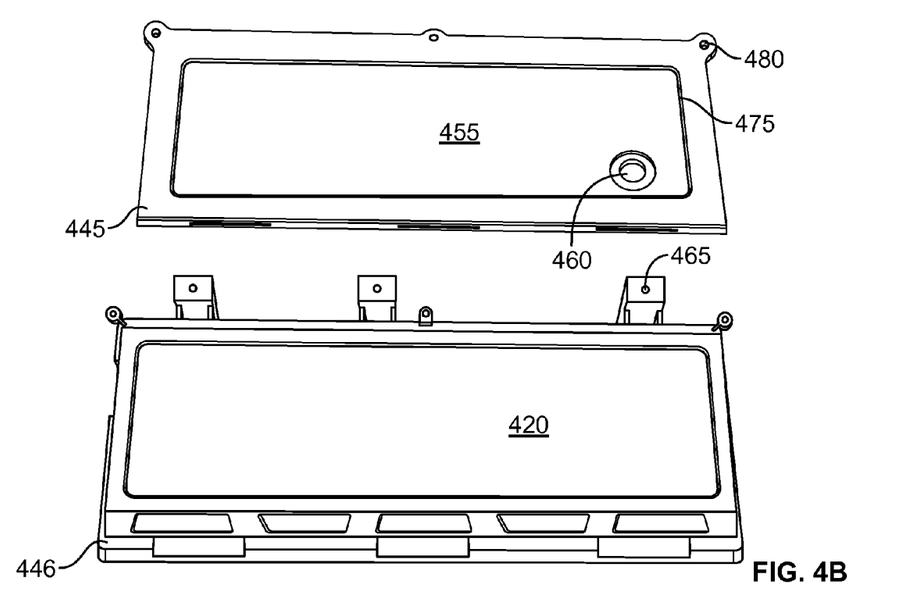
FIG. 4B is a top view of the reverse side of the enclosure top and the enclosure base from FIG. 4A in accord with embodiments.

FIG. 4A and FIG. 4B show outer enclosure top 455 and outer enclosure base 420. FIG. 4A shows one side of the outer enclosure top 455 and the outer enclosure base 420 while FIG. 4B shows the other side of the same outer enclosure top 455 and outer enclosure base 420. Visible in FIG. 4A is a port 460, a sealing seat 475, and connector openings 480 of the outer enclosure top 455. Also visible in FIG. 4A are connector receptacles 465, port 435, alignment spacer 430, and sealing seat 470 of the outer enclosure base 420. The edge connector, connector openings, and connector receptacles may serve as a connection means in embodiments. Visible in FIG. 4B on the outer enclosure top 455 are port 460, sealing seat 475, edge connector 445, and connector openings 480. Also visible in FIG. 4B on the outer enclosure base 420 are connector receptacles 465, and receptacle edge connector 446. The port 460 is shown without a flow blocking means as may be employed in embodiments.

As can be seen in the figures, the means of connecting the top to the base may be positioned outside of the sealing surfaces. This may be done to reduce the likelihood of piercing the sealing surfaces and also to promote better seal between the top and base. For example, in embodiments, the edge connector 445 may hook onto and below the receptacle edge connector 446 of the base 420. On the opposite edge of the top, the edge with the connector openings 480 may pull down through the connector openings 480 into the connector receptacles 465 to secure the top 445 to the base 420 and to compress or otherwise seal the sealing seat 470 and 475.

As can be seen in FIG. 4A, the spacing of the connector receptacles 465 may not be uniform and the spacing of the alignment spacers 430 may be uniform. The converse may also be true in embodiments. As can also be seen in FIG. 4A, ports 435 may exist on both sides of the enclosure base 420 such that cabling can be connected to a printed circuit board or electrical components within the base from both sides. Likewise, a port 460 may also exist in the enclosure top 455. Still further, in embodiments, various other ports may also exist in addition to or rather than the ports shown in the figures herein. Also, as shown, in embodiments, the top and base of the enclosure may be mated by screws that are outside of a gasket, such that the mechanical coupling formed at the screws need not be watertight. Also, in embodiments, the enclosure may be designed so that fewer edges need to be fastened with screws or other additional fasteners.

The base of outer enclosure may be cast or molded such that additional features, such as post holes and heat sinks 421, may also be readily added. The enclosure top may be fully removable or hinged such that it may be readily opened and closed. In embodiments, the enclosure top may behave as a "pizza box" top, with the top, coupled to the bottom, being able to lay flat in an open position and being secured in a closed position.

In embodiments, the gasket and sealing seat may provide some, substantial, most, or all of the needed moisture protection for the electrical components in the enclosure. As noted, the fasteners may be positioned on the outer periphery of the enclosure so that the risk of leakage through the fasteners is reduced. The properties and resilience of a sealing gasket positioned around the top and the base may add further sealing integrity and may supplement the sealing provided by potting material.

In embodiments, an "open-box" design, as is shown in FIGS. 4A and 4B, may provide that the PCB and a portion of the casing can be mounted together before applying the potting material and placing the components in the enclosure. With the cover removed, the potting material may be poured over the PCB and into the plastic casing until filled. In embodiments, a higher viscosity potting material may be selected such that the potting material may readily flow around electrical components, forming a void-free seal, at room or minimally elevated temperatures. The casing may then be further assembled, now with the potting material within it. When a partial or full skyline design is used for the casing, the size and number of empty voids in the casing may be limited and the necessary volume of potting material required may be reduced as well. In embodiments, vertical ridges on the metal cover may be used for seating the case as well.

Still further, in embodiments, ridge-like features may be added to the enclosure base lower edge. These features may be drilled/tapped so that users can add more features, such as hooks, clasps, shells, cable management systems, etc.

Figure 5:
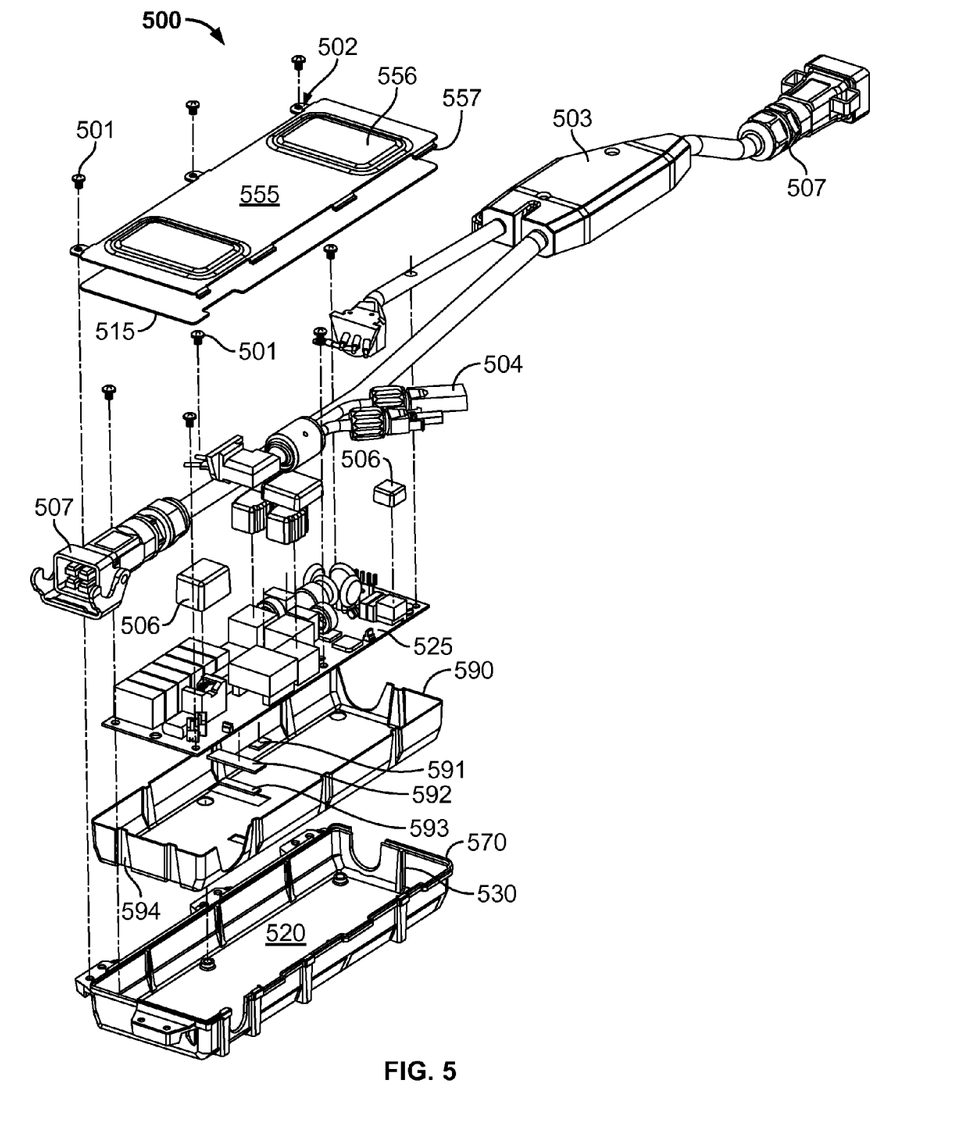
FIG. 5 is an exploded perspective view of a cover assembly, electronics, and cabling in accord with embodiments.

FIG. 5 shows an exploded isometric view of a cover assembly, electronics and cabling 500 in accord with embodiments. As can be seen in FIG. 5, an outer enclosure top 555 may be coupled to an outer enclosure base 520, and various components may be positioned between and within this top and base.

Visible in FIG. 5 are connector screws 501, cover domes 556, an AC junction assembly 503, AC connectors 507, an insulated shield casing top 515, DC connectors 504, sleeves for magnetic components 506, a printed circuit board with exposed electrical components 525, a casing bottom 590, thermal pads 591-593, a sealing seat 570, multiple alignment spacers 530, and multiple structural reinforcement contours 594.

In embodiments, and as shown in FIG. 5, the casing bottom 590 and the casing top 515 may surround and protect the printed circuit board 525 and the various components atop the printed circuit board, below the printed circuit board, and connected to the printed circuit board. As can be seen, the casing top 515 shown in FIG. 5 is a flat profile and not a skyline profile as shown in FIG. 1, or a semi-skyline profile as shown in FIG. 2. As also shown in FIG. 5, and in embodiments, the connector screws 501 may secure the printed circuit board 525 to the outer enclosure base 520 and may also secure the outer enclosure cover 555 to the base 520.

During assembly, potting material may be placed in and around the printed circuit board 525. This may be done through the ports from above the printed circuit board during assembly, and through other methods and openings as well. The dome 556 of the enclosure cover 555 may allow for expansion and contraction of the casing top 515. This expansion and contraction may be preferred in order to reduce, minimize, or eliminate expansion and contraction forces from being placed on the printed circuit board 525 and the exposed electrical components located thereon.

Figure 6:
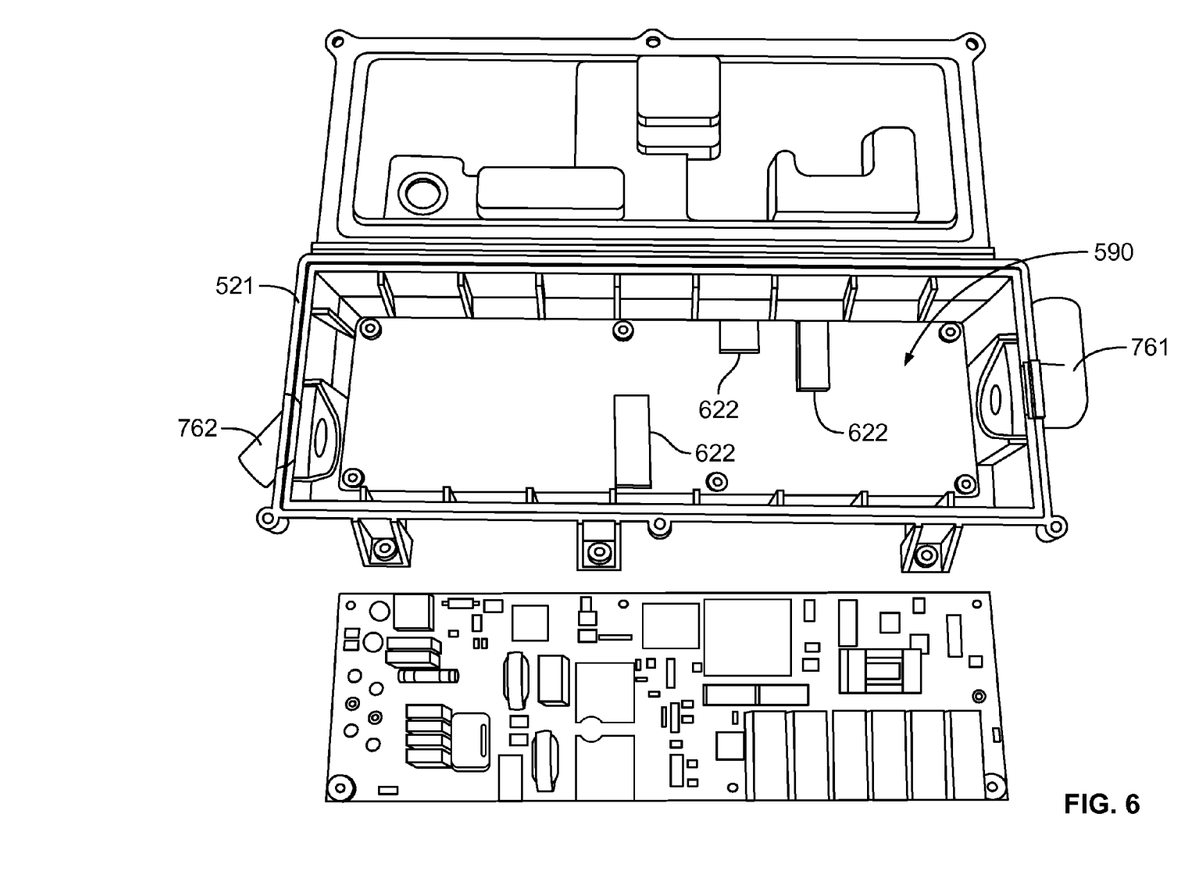
FIG. 6 is a top view of an open enclosure including a bottom casing and a removed electronic printed circuit board in accord with embodiments.
Figure 7:
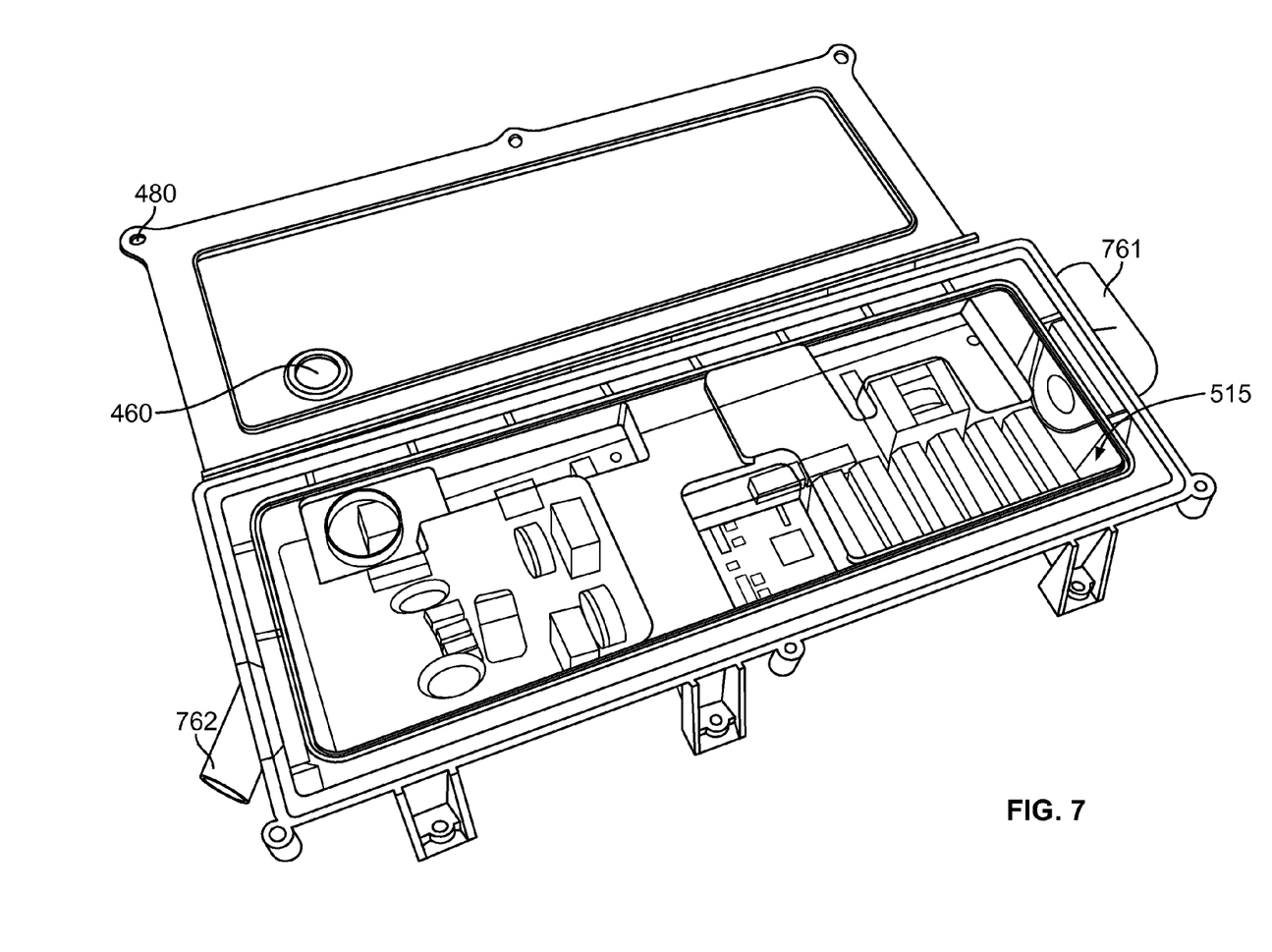
FIG. 7 is a top view of an open enclosure with a top casing, a bottom casing, and a printed circuit board between the two, in accord with embodiments.

FIG. 6 and FIG. 7 show a partially assembled cover assembly, electronics, and cabling in accord with embodiments. FIG. 6 shows an enclosure cover connected along an edge to the base, with cable sleeves 761 and 762 attached. Also visible in FIG. 6 is the printed circuit board and thermal transfer pads 622 of the casing 590.

During assembly the printed circuit board may be positioned within the casing 590 such that the thermal transfer pads 622 may be in contact with the printed circuit board or components thereon in order to allow heat to be drawn away from the printed circuit board and onto the casing during operation of the electrical components. The gasket seat or gasket ridge 521 may accept a gasket and together may serve as a sealing surface to prevent moisture or other environmental contaminants from entering the sealed assembly.

In FIG. 7, the printed circuit board and the casing top 515 have been inserted into the base. Also labeled in FIG. 7 is the connector opening 480, the port 460, and cable sleeves 762 and 761. As can be seen in FIG. 7, prior to closing the cover and sealing it down, the port 460 may align with an opening in the casing top 515, and the casing top 515 may be seated near or directly against the gasket seat or gasket ridge 521. During assembly, prior to or after the closure of the cover of FIG. 7 potting material may be added in and around electronics the printed circuit board.

Figure 8:
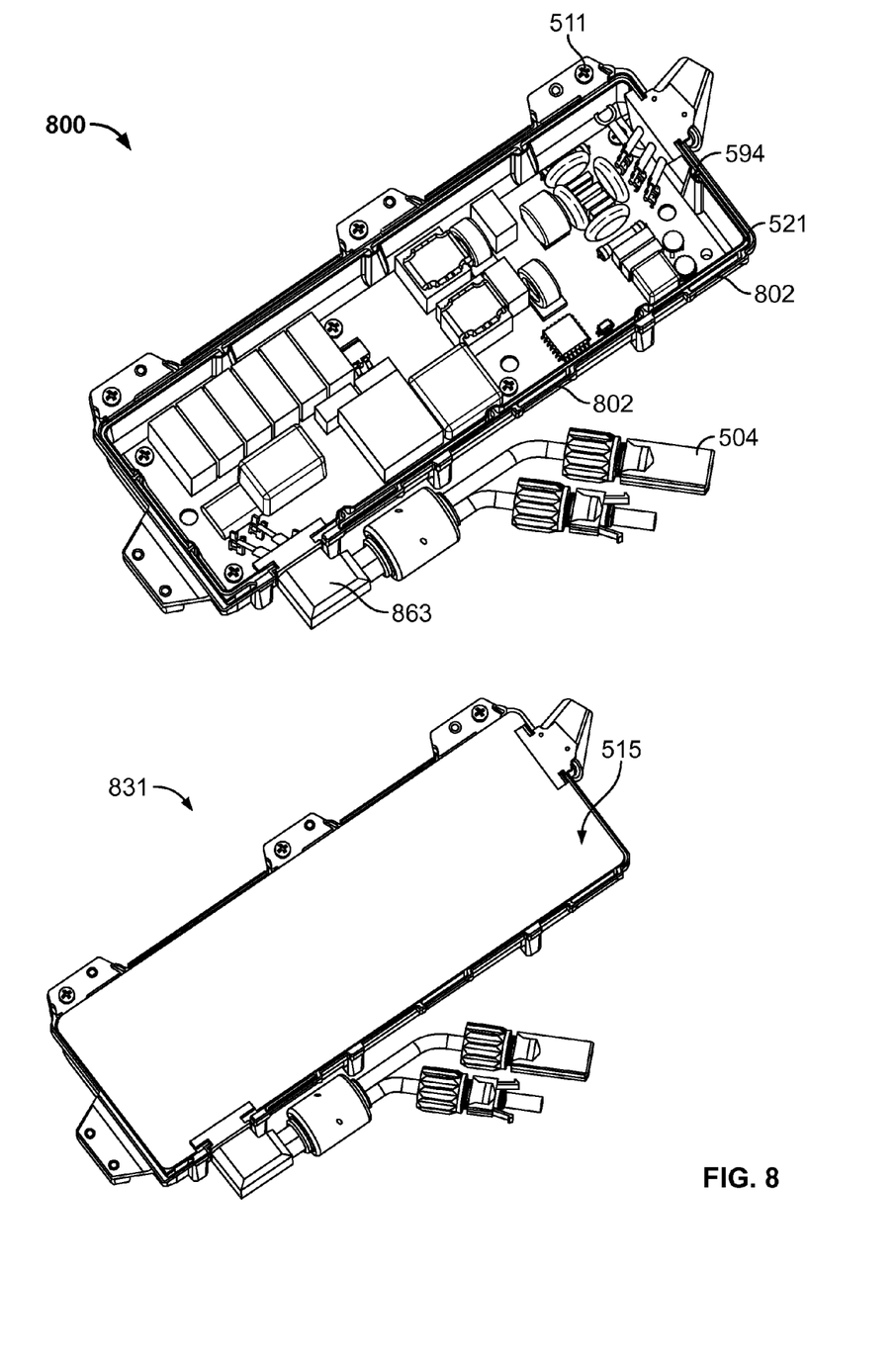
FIG. 8 shows two partially assembled enclosures in accord with embodiments.

FIG. 8 shows an embodiment with electronics before and after being covered with a casing top 515. The embodiment with electronics 800 is shown without the casing top, while the embodiment with electronics 831 is shown with the casing top 515. As shown in FIG. 8, in embodiments, the ports entering and exiting the casing and the enclosure may not be opposite each other but may be in various positions. For example, shown with the assembly 800, the DC connector 504 enters the side of the case in the side of the enclosure through a unified sleeveless connector 863, while the AC connection to the printed circuit board is made to an end of the PCB, and an end of the case, and an end of the enclosure.

Also visible in FIG. 8 are the structural reinforcement contours 594, the sealing seat 570, and the edge connector receptacles 802. Thus, in embodiments, the combination of the edge connector receptacle 802 and the sealing seat 570, together an example of a connection means, may serve to prevent moisture or other environmental contaminants from entering into the casing or the enclosure when in a closed position. Also, as can be seen in FIG. 8, the casing top 515 need not have a port or other opening in embodiments.

Figure 9:
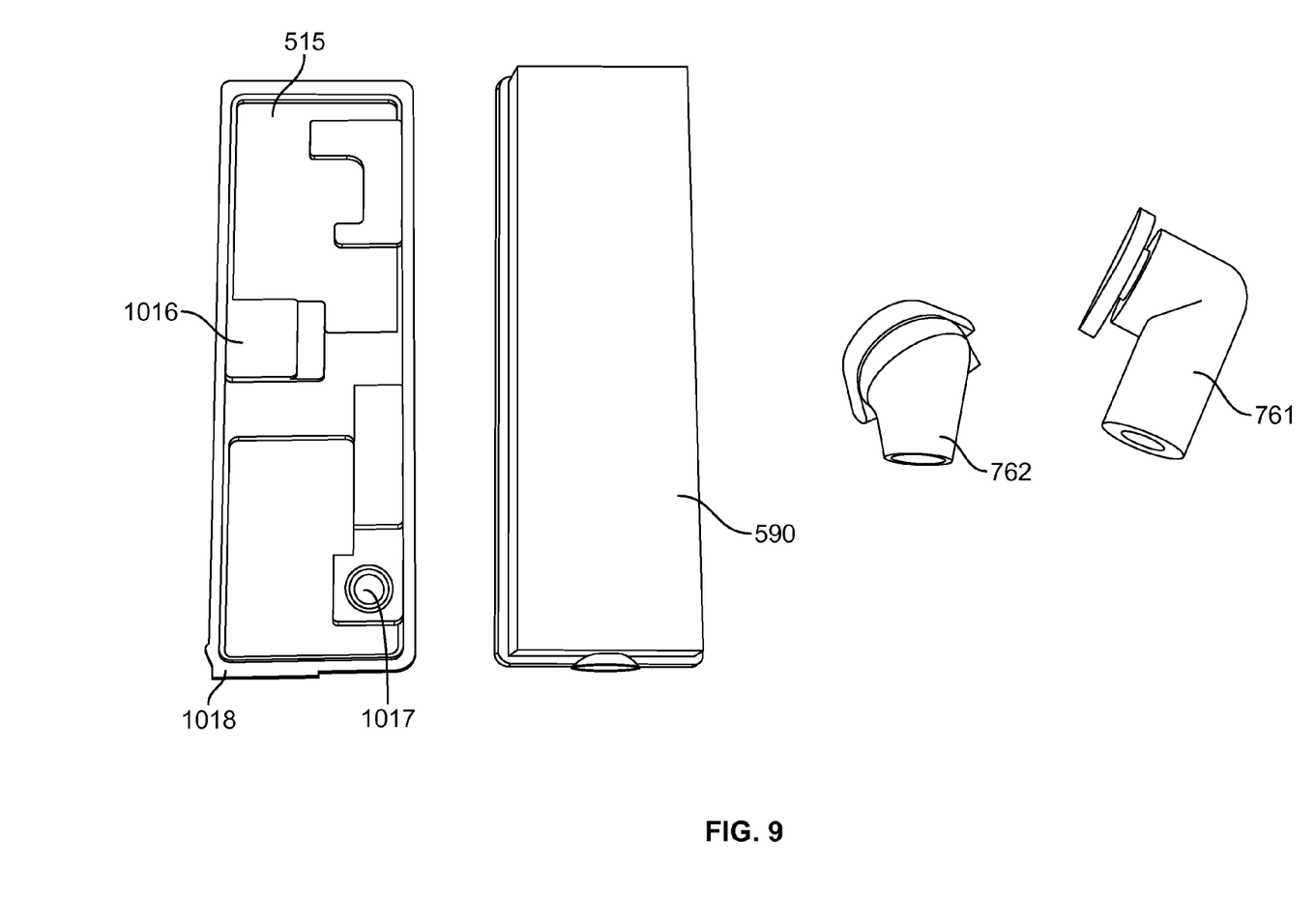
FIG. 9 shows an overhead view of insulated casings and sleeve shields in accord with embodiments.

FIG. 9 shows a plan view of a casing top 515, casing bottom 590, sleeve 761 and sleeve 762 in accord with embodiments. A tiered dome 1016 is shown on the casing top 515. Also visible is a casing port punch-out 1017, and casing sealing edge 1018. The sleeves 761 and 762 are shown as angled sleeves with various contours and recesses to accommodate cabling and provide sealing with the cabling and the enclosure and casing. The casing port punch-out may be removed during assembly to provide for potting placement, for thermal transport through the casing, and for other reasons as well.

Figure 10:
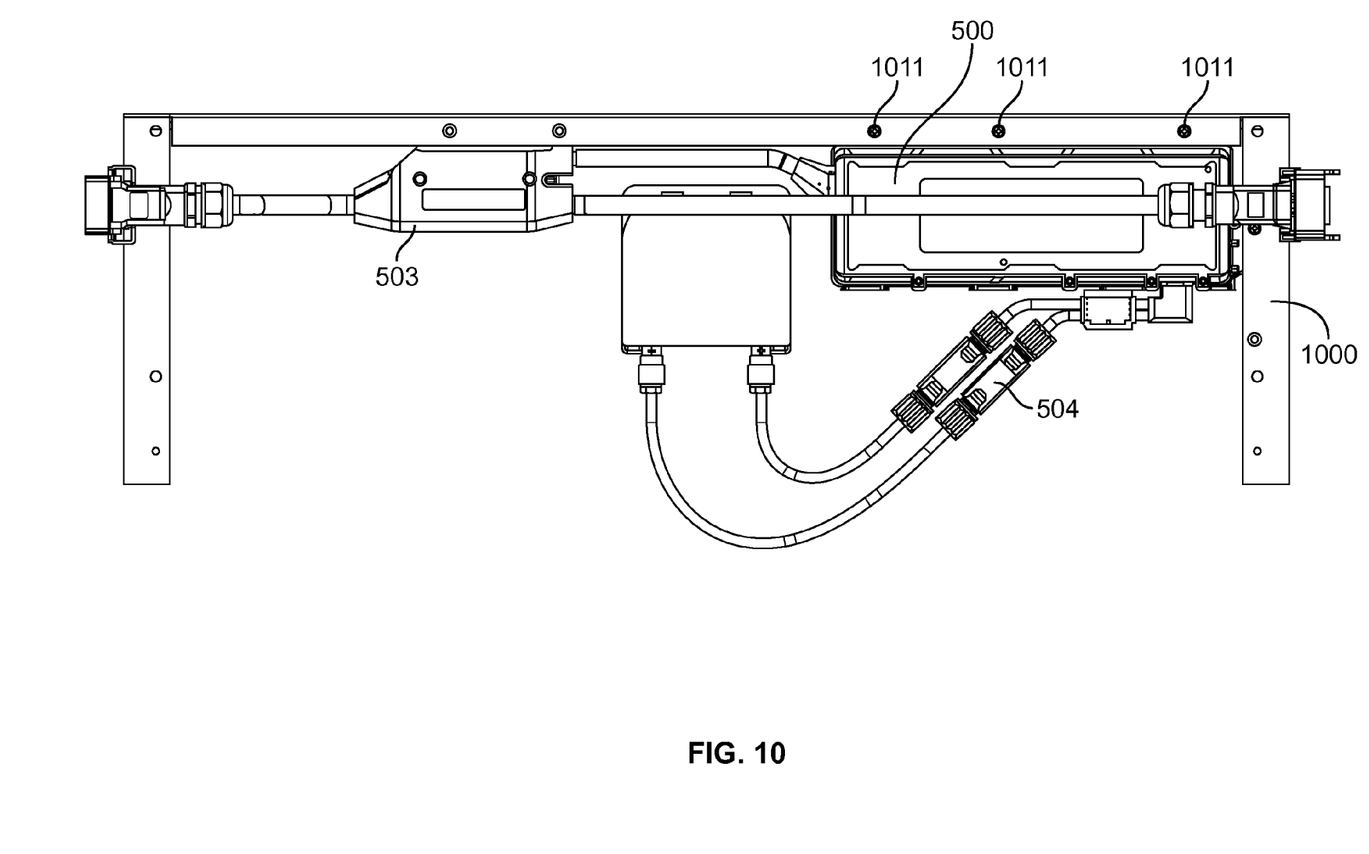
FIG. 10 shows a plan view of a cover assembly, electronics, and cabling mounted on a photo-voltaic module frame in accord with embodiments.

FIG. 10 shows a plan view of a cover assembly, electronics, and cabling assembly 500 attached to a mounting frame 1000 of a photovoltaic module in accord with embodiments. Screw connectors 1011 are shown through the mounting frame 1000 into the cover assembly, electronics and cabling assembly 500. Also visible in FIG. 10 are the DC connector 540, and the AC junction assembly 503. In embodiments, solar panel microinverters may need to be accommodated in size and coupling methods to specific photovoltaic (PV) frames, which can vary by PV manufacturer. For example, in this embodiment, a long edge is the predominant mounting surface. In embodiments, this long edge can be further adapted to coincide with different manufacturers' PV frames.

Figure 11:
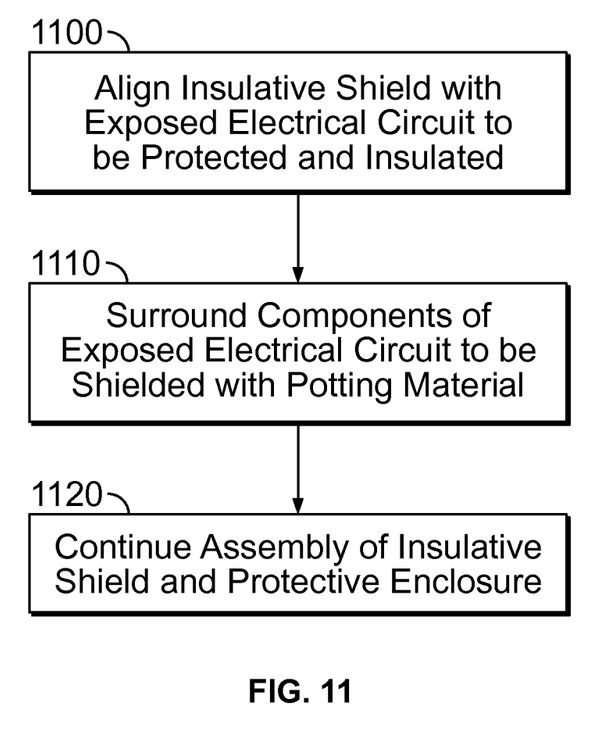
FIG. 11 shows process features as may be employed in accord with embodiments.

FIG. 11 shows the flow of a process as may be employed in accord with embodiments. As shown at 1100, an insulated shield casing may be aligned with exposed electrical circuits to be protected and insulated; and as shown at 1110, a potting material may be placed around the components of the exposed electrical circuit to be shielded. During placement or once placed, as shown at 1120, the assembly of the insulated shield and the protection of the enclosure may continue. These process embodiments may employ some of the various features taught throughout this application. These features may be combined from the various figures embodiments and may be combined in various and still different ways.

Figure 12:
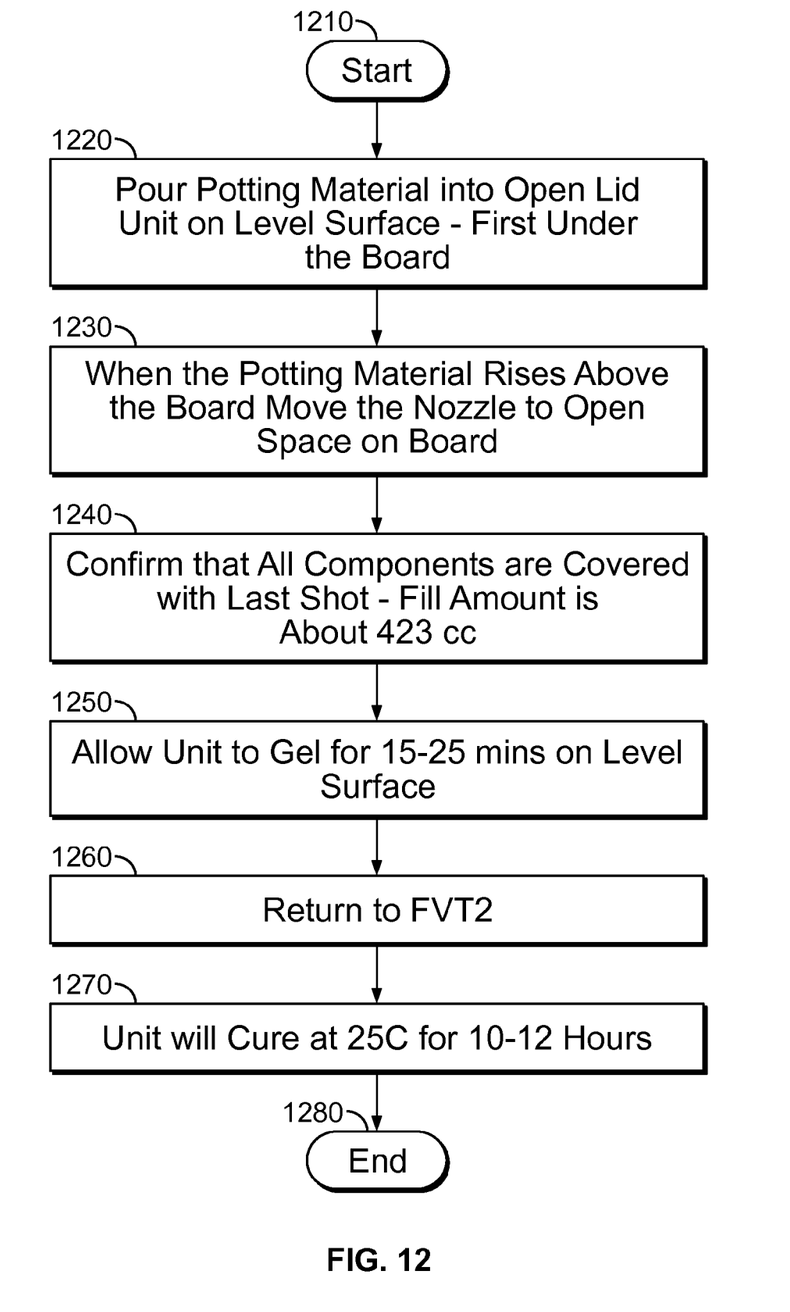
FIG. 12 shows process features as may be employed in accord with embodiments.

FIG. 12 shows a process as may be employed in various ways in embodiments. As with FIG. 11, features and steps of this process may be formed in various orders and may be conducted with more or less activity. Likewise, components described throughout may be used or assembled in various ways and with other components.

As shown in FIG. 12, processes may start at 1210. At 1220, potting material may be poured into an open casing on a level surface, first underneath the printed circuit board and, when the potting material rises above the board, at 1230, atop the board by moving a nozzle dispensing the potting to an open space on the board. As shown at 1240, confirmation that the potting material covers all the components may be made and the potting material poured over the printed circuit board may be measured. In embodiments, 423 ml of potting material may be a target measure, but in embodiments, depending upon the casing dimensions, and the dimensions of the PCB and the properties of the potting material and the casing, other target volumes of dispensed potting may also be used. These target volumes may include ranges of fill from less than half to near or at 100% percent potting fill. The targeted volume of dispensed potting and the targeted percentage potting fill may depend on the potting material being used, on the size of the printed circuit boards and electrical components, the spacing between the printed circuit board and the casing, and on other variables and considerations as well.

At 1250, the potting may be allowed to cure for a period of time, for example, 15 to 20 minutes on a level surface. This curing may be accelerated by the addition of heat, radiation, or the use of some other kind of accelerant. At 1260, the assembly may return to another step, here shown as Functional Verification Testing 2 (FVT2). This FTV2 may be the second functional testing of the components to verify their proper function. As shown at 1270, curing may occur at a target temperature, here 25° C., for a determined period of time, such as 10 to 12 hours. Other features and different features and steps may be performed as well. Once sealed in potting, however, if the component fails the FVT2, repair may not be possible and component may need to be discarded. 1280 shows an end to the assembly.

In preferred embodiments the potting material may exhibit a viscosity of 7000 cp or lower @25° C., have a hardness of 70 avg Shore A, and exhibit a coefficient of thermal expansion of 190 ppm or lower. These properties for the potting material are not limiting as potting material in embodiments may exhibit other properties, even higher ones, for viscosity, hardness, and thermal expansion as well.

Still further, in embodiments, the potting material may have a low viscosity to assist in pouring the potting material. The potting material may also be selected to minimize thermal forces on the electronic components. Here a low coefficient of thermal expansion for the potting material can provide for a higher Shore A while a higher coefficient of thermal expansion may provide for a needed lower Shore A hardness. An Epic Resin S7302-01 may be used as a potting material in embodiments. Other particulars of this potting material include a viscosity of 2500-3500 cps, a Shore A hardness of 68-72, a CTE $(175-190)10^{-6}1/C$, a cure time of 10-12 hours @25° C., a gel time of 15-25 minutes, an RTI of 50° C. and a TG of −50° C.

In embodiments, the use of casing may eliminate or greatly increase the UL requirement of having a Relative Temperature Index of a certain score. For example, past limits of 90° C. may be greatly increased or eliminated altogether in embodiments.

In embodiments, the potting material may have a working life of 15 minutes or more and may comprise an epoxy/amine with various colors, including: clear, black, white, and other colors. In embodiments, curing may require elevated temperatures, the introduction of radiation, or the use of other accelerant techniques.

The terminology used herein is for the purpose of describing particular embodiments only and is not intended to be limiting of the invention. As used herein, the singular forms "a," "an" and "the" are intended to include plural forms as well, unless the context clearly indicates otherwise. It will be further understood that the terms "comprises" and/or "comprising," when used in this specification, specific to the presence of stated features, integers, steps, operations, elements, and/or components, but do not preclude the presence or addition of one or more other features, integers, steps, operation, elements, components, and/or groups thereof.

Embodiments may also be implemented as a computer process, a computing system or as an article of manufacture such as a computer program product of computer readable media. The computer program product may be a computer storage medium readable by a computer system and encoding computer program instructions for executing a computer process.

The corresponding structures, material, acts, and equivalents of all means or steps plus function elements in the claims below are intended to include any structure, material or act for performing the function in combination with other claimed elements as specifically claimed. The foregoing description has been presented for purposes of illustration and description, but is not intended to be exhaustive or limited to the invention in the form disclosed. Many modifications and variations may be done without departing from the scope and spirit of the invention. The embodiment was chosen and described in order to best explain the principles of the invention and the practical application, and to enable others of ordinary skill in the art to understand the invention for embodiments with various modifications as are suited to the particular use contemplated.

What is claimed is:

1. A power converter comprising:
   a plurality of electrical components connected to a printed circuit board;
   an outer enclosure surrounding one or more of the electrical components;
   an electrical insulative casing positioned between one or more of the electrical components and the outer enclosure, the casing comprising a polymer or other nonmetallic material; and
   a potting material, the potting material positioned between the electrical insulative casing and one or more of the electrical components,
      wherein the electrical insulative casing comprises one or more ports, the ports providing access to electrical components when the power converter is fully assembled or to potting material flow during assembly of the power converter or both.

2. The power converter of claim 1 wherein the potting material is insufficient to meet one or more published requirements for insulative capacity and wherein the insulative casing alone or in combination with the potting material is sufficient to meet or exceed one or more published requirements for insulative capacity of electrical components within the outer enclosure.

3. The power converter of claim 1 wherein at least the outer enclosure comprises five or more sides or the printed circuit board comprises a solar photovoltaic module microinverter having a DC input and an AC output.

4. The power converter of claim 1 wherein the electrical insulative casing comprises a top having a full skyline or partial skyline profile, the full skyline profile mimicking a profile of several electrical components, the partial skyline profile mimicking a profile of at least one electrical component.

5. The power converter of claim 1 wherein the outer enclosure comprises a base, the base comprising casing spacers, one or more thermal pads, and means for connecting the base with a cover.

6. The power converter of claim 1 wherein the outer enclosure comprises a base and a cover, the base and a cover sealable with a sealing gasket, wherein connecting means serve to hold the base and cover together, and wherein the connecting means is outside of the perimeter of the sealing gasket.

7. The power converter of claim 1 wherein the outer enclosure comprises a base and a cover, the cover comprising one or more domes, a sealing edge and a plurality of tabs, the sealing edge and plurality of tabs positioned to mate with the base when the outer enclosure is in a closed configuration.

8. The power converter of claim 1 further comprising a port flow blocking means.

9. The power converter of claim 1 wherein the potting material covers targeted electrical components with a minimum thickness of potting material.

10. The power converter of claim 1 further comprising a photovoltaic module or other renewable energy source, the photovoltaic module or other renewable energy source electrically coupled to the printer circuit board.

11. A process for assembling an electrical component enclosure, the process comprising:
positioning a printed circuit board within an electrical insulative casing;
positioning the printed circuit board and insulative casing within an outer enclosure; and at least one of the following,
punching out a punchout on the insulative casing, the insulative casing comprising a polymer or another nonmetallic material, or
placing a gasket between a top of the outer enclosure and a bottom of the outer enclosure and securing the outer enclosure top to the outer enclosure bottom with fasteners positioned outside of the gasket and a seal created by the gasket mating with the outer enclosure top and the outer enclosure bottom,
wherein before or after each of the previous positioning steps, deploying potting material near and around electrical components on the printed circuit board, the potting material insufficient by itself to provide the amount of electrical insulative resistance necessary to satisfy one or more previously published electrical requirements for the printed circuit board and electrical components, and
wherein the electrical insulative casing comprises one or more ports, the ports providing access to electrical components when the electrical insulative casing is fully assembled or to potting material flow during assembly of the electrical insulative casing or both.

12. The process of claim 11 further comprising:
selecting the potting material after considering the electrical insulative properties of the electrical insulative casing.

13. The process of claim 11 further comprising:
curing the potting material with heat or light.

14. The process of claim 11 further comprising:
forming the profile of the insulative casing to mimic electrical components of the printed circuit board, and
deploying potting material to fill voids between the insulative casing and the electrical components.

15. A power converter comprising:
a plurality of electrical components connected to a printed circuit board;
an outer enclosure surrounding one or more of the electrical components;
an electrical insulative casing positioned between one or more of the electrical components and the outer enclosure, the casing comprising a polymer or other nonmetallic material; and
a potting material, the potting material positioned between the electrical insulative casing and one or more of the electrical components,
wherein the electrical insulative casing fully surrounds one or more of the electrical components,
wherein the electrical insulative casing comprises one or more structural reinforcement contours on a casing wall, and
wherein the outer enclosure comprises a metal.

16. A power converter comprising:
a plurality of electrical components connected to a printed circuit board;
an outer enclosure surrounding one or more of the electrical components;
an electrical insulative casing positioned between one or more of the electrical components and the outer enclosure, the casing comprising a polymer or other nonmetallic material; and
a potting material, the potting material positioned between the electrical insulative casing and one or more of the electrical components,
wherein the outer enclosure comprises one or more thermal pads, wherein the electrical insulative casing comprises one or more openings for thermal energy to pass from at least one of the electrical components to a thermal pad.

17. The power converter of claim 16 wherein the printed circuit board comprises a solar photovoltaic module microinverter having a DC input and an AC output.

18. The power converter of claim 16 wherein the electrical insulative casing comprises a top having a full skyline or partial skyline profile, the full skyline profile mimicking a profile of several electrical components, the partial skyline profile mimicking a profile of at least one electrical component.

19. The power converter of claim 16 wherein the outer enclosure comprises a base, the base comprising casing spacers, one or more thermal pads, and means for connecting the base with a cover.

20. The power converter of claim 16 wherein the outer enclosure comprises a base and a cover, the base and a cover sealable with a sealing gasket, wherein connecting means serve to hold the base and cover together, and wherein the connecting means is outside of the perimeter of the sealing gasket.

21. The power converter of claim 16 wherein the outer enclosure comprises a base and a cover, the cover comprising one or more domes, a sealing edge and a plurality of tabs, the sealing edge and plurality of tabs positioned to mate with the base when the outer enclosure is in a closed configuration.

* * * * *